US009991865B2

(12) United States Patent
Klemens

(10) Patent No.: US 9,991,865 B2
(45) Date of Patent: Jun. 5, 2018

(54) INTEGRATED FILTERS IN OUTPUT MATCH ELEMENTS

(71) Applicant: QUALCOMM Incorporated, San Diego, CA (US)

(72) Inventor: Guy Klemens, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 35 days.

(21) Appl. No.: 14/601,844

(22) Filed: Jan. 21, 2015

(65) Prior Publication Data
US 2016/0211823 A1 Jul. 21, 2016

(51) Int. Cl.
H03B 1/00 (2006.01)
H03H 7/38 (2006.01)
H01F 27/28 (2006.01)
H03F 1/56 (2006.01)
H03H 7/09 (2006.01)
H03F 3/24 (2006.01)
H03H 7/01 (2006.01)
H01F 21/12 (2006.01)

(52) U.S. Cl.
CPC .......... *H03H 7/38* (2013.01); *H01F 27/2823* (2013.01); *H03F 1/565* (2013.01); *H03F 3/245* (2013.01); *H03H 7/09* (2013.01); *H01F 2021/125* (2013.01); *H03H 2007/013* (2013.01)

(58) Field of Classification Search
CPC ....... H01L 2924/00; H01L 2924/00014; H03F 1/565; H03F 2200/387
See application file for complete search history.

(56) References Cited

U.S. PATENT DOCUMENTS 5,095,285 A 3/1992 Khatibzadeh
5,451,914 A * 9/1995 Stengel ............... H01F 17/0006
333/25
8,432,237 B2 4/2013 Klemens et al.
8,610,503 B2 12/2013 Kaczman et al.
(Continued)

FOREIGN PATENT DOCUMENTS

GB 2456065 A 7/2009

OTHER PUBLICATIONS

International Search Report and Written Opinion—PCT/US2015/067581—ISA/EPO—dated Apr. 26, 2016.
(Continued)

Primary Examiner — Sibin Chen
(74) Attorney, Agent, or Firm — Patterson & Sheridan, L.L.P.

(57) ABSTRACT

Certain aspects of the present disclosure provide an integrated impedance matching and filtering circuit. One example circuit generally includes an impedance matching circuit having a first inductor and a resonant circuit having a resonant frequency and comprising a second inductor magnetically coupled to the first inductor. The resonant circuit is configured to filter out the resonant frequency from the impedance matching circuit. In certain aspects, the resonant circuit may further include a capacitor. The second inductor may include a ring of metal having a gap, and the capacitor may comprise a dielectric material between ends of the ring surrounding the gap. For other aspects, the capacitor may be an integrated circuit element, having a fixed or variable value.

32 Claims, 15 Drawing Sheets

(56) References Cited

U.S. PATENT DOCUMENTS

| | | | |
|---|---|---|---|
| 9,312,927 B2 | 4/2016 | Bhagat et al. | |
| 9,397,727 B1* | 7/2016 | Mattsson | H04B 5/0031 |
| 2006/0097811 A1 | 5/2006 | Nakamura et al. | |
| 2006/0261902 A1* | 11/2006 | Masuda | H03B 5/1265 |
| | | | 331/36 C |
| 2007/0182520 A1* | 8/2007 | Kawakubo | H01F 17/0006 |
| | | | 336/200 |
| 2008/0146144 A1* | 6/2008 | Rofougaran | H04B 1/08 |
| | | | 455/3.02 |
| 2010/0156194 A1 | 6/2010 | Navid et al. | |
| 2011/0068882 A1 | 3/2011 | Honda et al. | |
| 2011/0163824 A1 | 7/2011 | Kawano | |
| 2012/0258660 A1* | 10/2012 | Rajendran | H01Q 7/00 |
| | | | 455/41.1 |
| 2012/0262236 A1* | 10/2012 | Shirai | H03F 3/45179 |
| | | | 330/253 |
| 2013/0187712 A1 | 7/2013 | Cabanillas et al. | |
| 2014/0062817 A1 | 3/2014 | Ishizuka et al. | |
| 2014/0312977 A1 | 10/2014 | Kaczman et al. | |
| 2015/0103859 A1* | 4/2015 | Breeze | G01R 33/343 |
| | | | 372/82 |
| 2015/0180542 A1* | 6/2015 | Jang | H04B 5/0031 |
| | | | 455/41.1 |

OTHER PUBLICATIONS

Jones E. M. T. et al., "Coupled-Strip-Transmission-Line Filters and Directional Couplers", IRE Transactions on Microwave Theory and Techniques, vol. 4, Issue 2, Apr. 1956, IEEE, pp. 75-81.

* cited by examiner

INTEGRATED FILTERS IN OUTPUT MATCH ELEMENTS

TECHNICAL FIELD

Certain aspects of the present disclosure generally relate to radio frequency (RF) circuits and, more particularly, to an integrated impedance matching and filtering circuit.

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology) system, which may provide network service via any one of various 3G radio access technologies (RATs) including EVDO (Evolution-Data Optimized), 1×RTT (1 times Radio Transmission Technology, or simply 1×), W-CDMA (Wideband Code Division Multiple Access), UMTS-TDD (Universal Mobile Telecommunications System-Time Division Duplexing), HSPA (High Speed Packet Access), GPRS (General Packet Radio Service), or EDGE (Enhanced Data rates for Global Evolution). The 3G network is a wide area cellular telephone network that evolved to incorporate high-speed internet access and video telephony, in addition to voice calls. Furthermore, a 3G network may be more established and provide larger coverage areas than other network systems. Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, 3$^{rd}$ Generation Partnership Project (3GPP) Long Term Evolution (LTE) networks, and Long Term Evolution Advanced (LTE-A) networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

SUMMARY

Certain aspects of the present disclosure generally relate to an integrated impedance matching and filtering circuit. Such a circuit may be used in conjunction with a power amplifier (PA) in a radio frequency integrated circuit (RFIC) for a wireless transmitter, for example, in an effort to attenuate one or more harmonic and/or other undesirable frequencies from the PA's output signal.

Certain aspects of the present disclosure provide an integrated impedance matching and filtering circuit. This circuit generally includes an impedance matching circuit comprising a first inductor. The integrated impedance matching and filtering circuit also includes a first resonant circuit configured to filter out at least a portion of a first resonant frequency of the first resonant circuit from the impedance matching circuit. The first resonant circuit includes a second inductor magnetically coupled to the first inductor.

According to certain aspects, the first resonant circuit further includes a capacitor and is a resonant inductor-capacitor (LC) tank circuit. In certain aspects, the second inductor includes an open ring of metal, and the capacitor includes a dielectric material disposed between ends of the open ring of metal. In this case, the first inductor may include one or more rings of metal that surround the open ring of metal of the second inductor. In certain aspects, the open ring of metal of the second inductor is electrically shorted to one of the rings of metal of the first inductor. In certain aspects, the first resonant circuit further includes a switch interposed in the open ring of metal of the second inductor. In this case, a control line for the switch may be connected to the first inductor such that an amplitude of a signal in the first inductor is configured to control opening and closing of the switch. Alternatively, a control line for the switch may be connected to an entity external to the integrated impedance matching and filtering circuit (e.g., a processor).

According to certain aspects, the integrated impedance matching and filtering circuit further includes a second resonant circuit configured to filter out at least a portion of a second resonant frequency of the second resonant circuit from the impedance matching circuit, wherein the second resonant circuit comprises a third inductor coupled to the first inductor. In certain aspects, the first resonant frequency equals the second resonant frequency, whereas in other aspects, the first resonant frequency is different from the second resonant frequency. In certain aspects, the second resonant circuit further includes a capacitor, the third inductor includes an open ring of metal, and the capacitor includes a dielectric material disposed between ends of the open ring of metal of the third inductor. The open ring of metal of the third inductor may be disposed adjacent to an open ring of metal of the second inductor. Alternatively, the open ring of metal of the third inductor may be disposed inside an open ring of metal of the second inductor. In certain aspects, the first inductor includes one or more rings of metal that surround at least one of an open ring of metal of the second inductor or the open ring of metal of the third inductor.

According to certain aspects, the first resonant circuit is electrically floating and is configured to lack a connection to another circuit with an electrically conductive material. In this case, the first inductor is not connected to the second inductor.

According to certain aspects, the first inductor is electrically shorted to the second inductor.

According to certain aspects, a loop of the first inductor is substantially surrounded by a loop of the second inductor. In other aspects, a loop of the first inductor substantially surrounds a loop of the second inductor (e.g., the loop of the second inductor is disposed inside the loop of the first inductor). In either case, a trace forming the loop of the first inductor is located adjacent to a trace forming the loop of the second inductor.

According to certain aspects, the first resonant frequency is a harmonic frequency of an output signal from an amplifier coupled to the impedance matching circuit. The harmonic frequency may be a second harmonic, a third harmonic, or another harmonic of the output signal.

According to certain aspects, the first resonant frequency is designed to be an unwanted frequency in the impedance matching circuit. For example, the unwanted frequency may be a global positioning system (GPS) frequency.

According to certain aspects, the first resonant frequency is configured to increase an efficiency of an amplifier coupled to the impedance matching circuit. In this case, the first resonant frequency may be at or near a harmonic frequency of an output signal from the amplifier.

According to certain aspects, the impedance matching circuit includes a transformer having a primary winding and a secondary winding magnetically coupled to the primary winding. The first inductor may be the primary winding or the secondary winding. In this case, the first resonant circuit may further include a capacitor, the second inductor may comprise an open ring of metal, and the capacitor may comprise a dielectric material disposed between ends of the open ring of metal. In certain aspects, the first inductor comprises one or more rings of metal that surround the ring of metal of the second inductor. In this case, one or more traces connected to the second inductor may be disposed between traces forming the primary and secondary windings.

According to certain aspects, the impedance matching circuit is a differential impedance matching circuit having the first inductor in a first branch of a differential signal pair and having a third inductor in a second branch of the differential signal pair. In this case, the integrated impedance matching and filtering circuit may further include a second resonant circuit having the first resonant frequency and comprising a fourth inductor coupled to the third inductor, wherein the second resonant circuit is configured to filter out at least a portion of the first resonant frequency from the second branch of the differential signal pair.

Certain aspects of the present disclosure provide a radio frequency integrated circuit (RFIC). The RFIC generally includes a power amplifier, an impedance matching circuit coupled to the power amplifier, and a resonant circuit having a resonant frequency. The impedance matching circuit typically includes a first inductor and is configured to match an output impedance of the power amplifier. The resonant circuit typically includes a second inductor magnetically coupled to the first inductor and is configured to filter out at least a portion of the resonant frequency from the impedance matching circuit. The resonant frequency may be a harmonic frequency of an output signal from the power amplifier.

Certain aspects of the present disclosure provide a method of filtering. The method generally includes amplifying a signal via an amplifier and filtering the amplified signal by at least filtering out at least a portion of a resonant frequency from an impedance matching circuit via a resonant circuit having the resonant frequency. The resonant circuit is magnetically coupled to the impedance matching circuit for the amplifier.

Certain aspects of the present disclosure provide an apparatus for wireless communications. The apparatus generally includes means for amplifying a signal, means for impedance matching an output impedance of the means for amplifying, and means for filtering out at least a portion of the amplified signal from the means for impedance matching at a resonant frequency. The means for filtering has the resonant frequency and is magnetically coupled to the means for impedance matching.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the present disclosure are described below. It should be apparent that the teachings herein may be embodied in a wide variety of forms and that any specific structure, function, or both being disclosed herein is merely representative. Based on the teachings herein, one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect may comprise at least one element of a claim.

The word "exemplary" is used herein to mean "serving as an example, instance, or illustration." Any aspect described herein as "exemplary" is not necessarily to be construed as preferred or advantageous over other aspects.

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art.

An Example Wireless System

Figure 1:
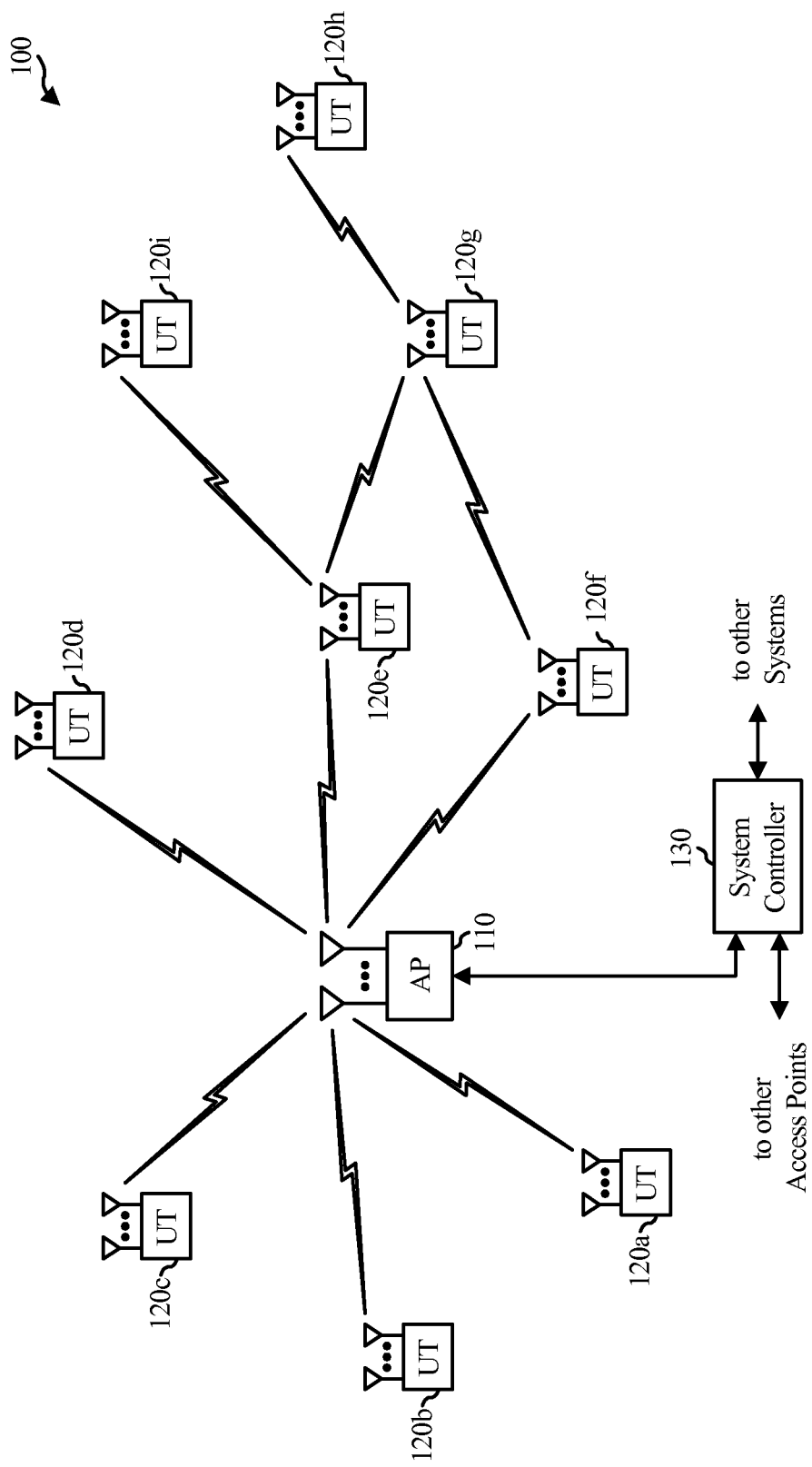
FIG. 1 is a diagram of an example wireless communications network in accordance with certain aspects of the present disclosure.

FIG. 1 illustrates a wireless communications system 100 with access points 110 and user terminals 120. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., in order to keep costs down) or multiple antennas (e.g., where the additional cost can be supported).

Figure 2:
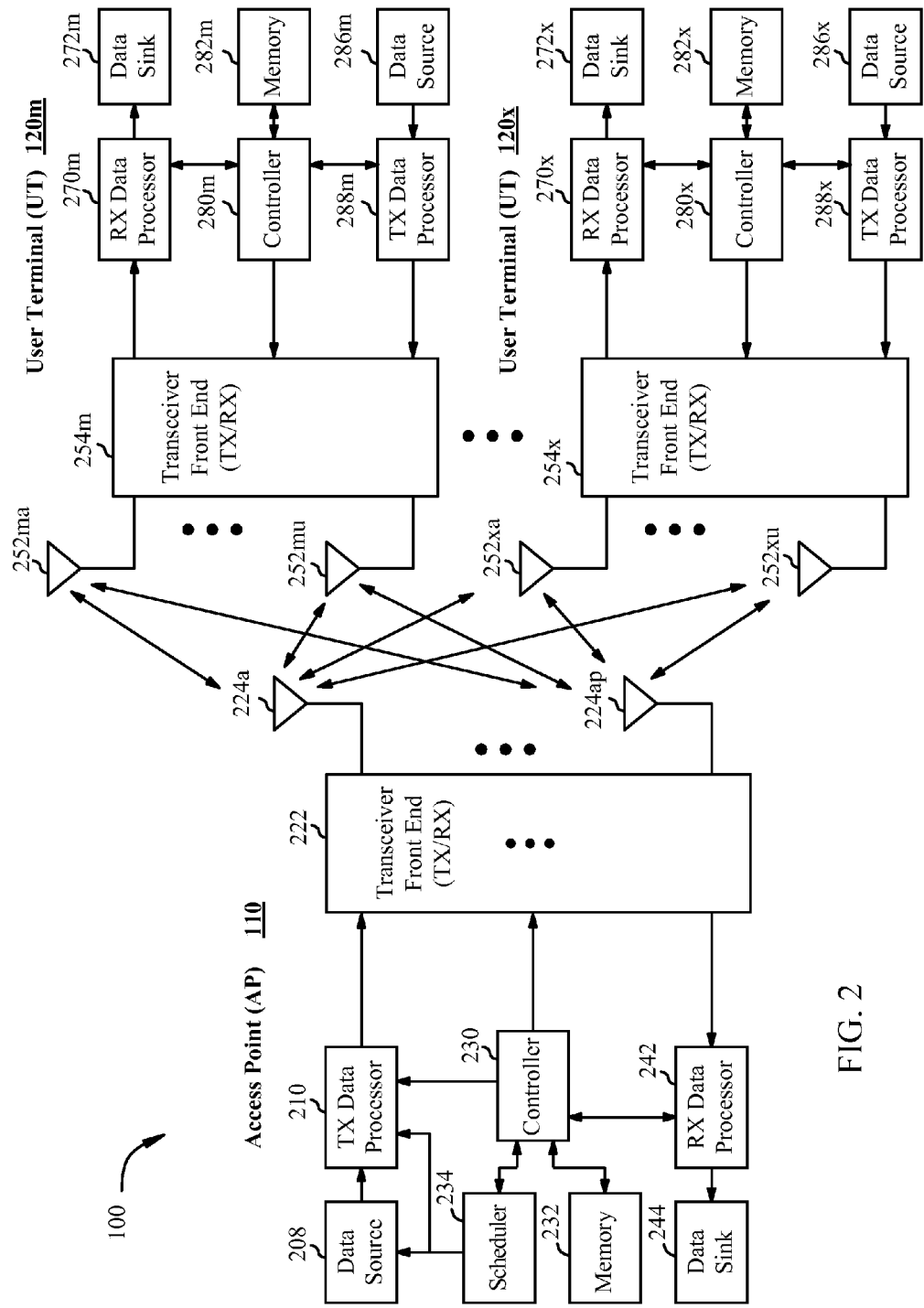
FIG. 2 is a block diagram of an example access point (AP) and example user terminals in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. For certain aspects of the present disclosure, a combination of the signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230

At each user terminal 120, $N_{ut,m}$ antennas 252 receive the downlink signals from access point 110. For receive diversity at the user terminal 120, the transceiver front end 254 may select signals received from one of the antennas 252 for processing. For certain aspects of the present disclosure, a combination of the signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof.

Figure 3:
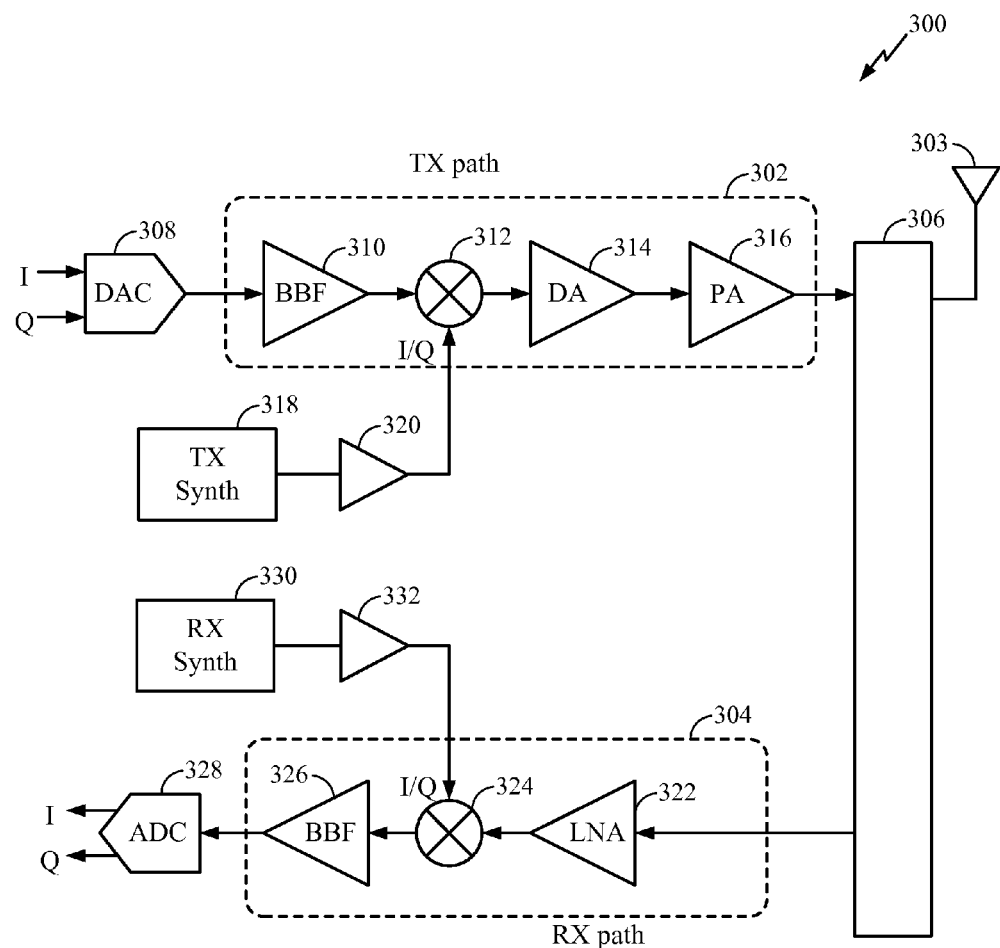
FIG. 3 is a block diagram of an example transceiver front end in accordance with certain aspects of the present disclosure.

FIG. 3 is a block diagram of an example transceiver front end 300, such as transceiver front ends 222, 254 in FIG. 2, in accordance with certain aspects of the present disclosure. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 is often external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). Known as heterodyning, this frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which are amplified by the DA 314 and by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO is typically produced by a TX frequency synthesizer 318, which may be buffered or amplified by amplifier 320 before being mixed with the baseband signals in the mixer 312. Similarly, the receive LO is typically produced by an RX frequency synthesizer 330, which may be buffered or amplified by amplifier 332 before being mixed with the RF signals in the mixer 324.

Example Integrated Impedance Matching and Filtering Circuit

Figure 4A:
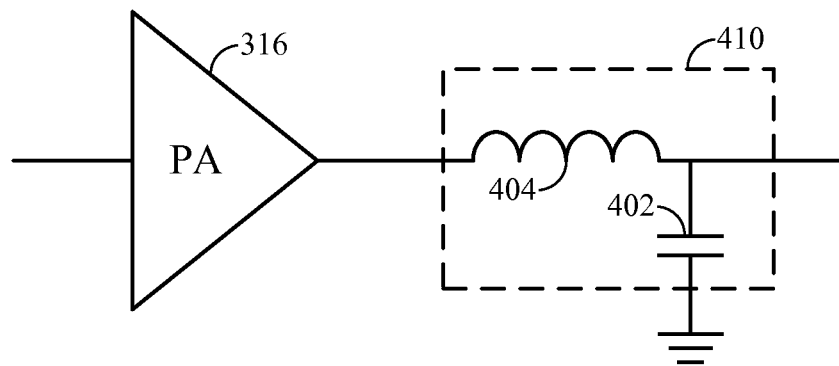
FIGS. 4A and 4B are example schematics of a power amplifier connected to an impedance matching circuit, which may be coupled with a resonant circuit, in accordance with certain aspects of the present disclosure.

As noted above, the PA 316 may be used to amplify RF signals before transmission by the antenna 303. In order for the antenna 303 to be driven effectively by the amplified RF signal, the output impedance of the PA 316 may be matched using an impedance matching circuit 410 as illustrated in FIG. 4A. The impedance matching circuit 410 may include an inductor 404 connected with a first terminal of a capacitor 402. The second terminal of the capacitor 402 may be connected with a reference potential (e.g., electrical ground, as shown).

Moreover, the output of the PA 316 may not only generate an amplified RF signal at a fundamental frequency, but also one or more harmonic frequencies. These harmonics typically exist at frequencies that are multiples of the fundamental frequency (f). For example, these harmonics may exist at twice the fundamental frequency (2f), three times the fundamental frequency (3f), and so on. As the frequency of the harmonics increases, energy at the harmonic frequency typically decreases. In other words, energy of a signal at the second harmonic frequency may be greater than energy at the third harmonic frequency. Other frequencies (e.g., GPS frequencies) may also couple into the signal output by the PA 316.

It is typically desirable to filter out these additional frequencies for various reasons. For example, the United States Federal Communications Commission (FCC) or other such entities impose strict limits on wireless transmission signals. Therefore, although not illustrated in FIG. 4A, one or more low pass filters may be coupled with the output of the PA 316 to filter out these harmonic frequencies. However, the low pass filters may consume a large amount of area in an integrated circuit. Real estate in integrated circuits is increasingly more valuable as devices become smaller and smaller and as more and more features and capabilities are added. Accordingly, what is needed are effective techniques and apparatus for filtering out these harmonic frequencies and/or other frequencies with reduced area consumption.

Figure 4B:
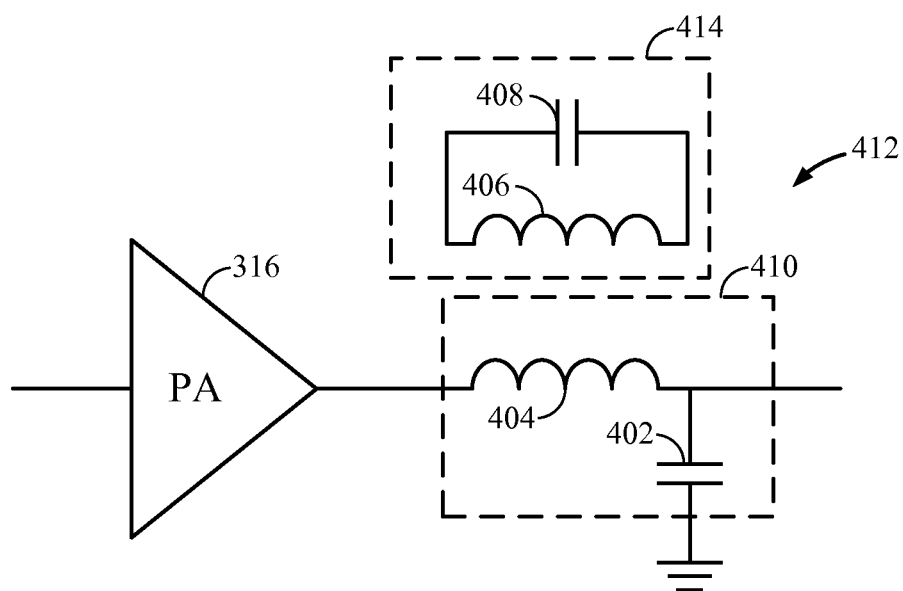

Certain aspects of the present disclosure provide an integrated impedance matching and filtering circuit 412 as illustrated in FIG. 4B. The circuit 412 may include an inductor 404 and a capacitor 402 which may be configured to match the load and source impedance as described above with respect to FIG. 4A. Moreover, the circuit 412 may include a resonant circuit 414 having an inductor 406 and a capacitor 408 (e.g., a resonant inductor-capacitor (LC) tank circuit). The values of the inductor 406 and capacitor 408 may be selected, configured, or otherwise designed such that the resonant circuit 414 operates at a resonant frequency matching any one of the harmonic frequencies, and/or other undesired frequencies described above. Moreover, the inductor 406 of the resonant circuit 414 may be coupled (e.g., magnetically coupled) with the inductor 404 of the impedance matching circuit 410. By coupling inductors 404 and 406, the resonant circuit 414 may extract energy from the impedance matching circuit 410 at the resonant frequency of the resonant circuit 414. At other frequencies, the resonant circuit 414 may operate effectively as an open circuit and may have little to no impact on the PA output signal. Accordingly, by matching the resonant frequency of the resonant circuit 414 to a harmonic frequency at the output of the PA 316, the resonant circuit 414 may extract energy at the harmonic frequency and operate as a band-stop filter having a narrow stop-band (also referred to as a notch filter). The resonant circuit may be configured to operate at any unwanted frequency of the PA 316 output signal, whether harmonic or otherwise. In certain aspects, the unwanted frequency may be a global positioning system (GPS) frequency as presented above.

In certain aspects, the resonant frequency may be designed to increase efficiency of the PA 316. In this case, the resonant frequency may be at or near a harmonic frequency (e.g., the second or third harmonic) of the output signal of the PA.

In certain aspects, the PA 316 may be a differential PA and may be coupled with a differential impedance matching circuit (not illustrated) having an inductor in a first branch of a differential signal pair and an inductor in a second branch of the differential signal pair. An inductor of a first resonant circuit may be coupled with the inductor in the first branch, and an inductor of a second resonant circuit may be coupled with an inductor in the second branch.

Figure 5:
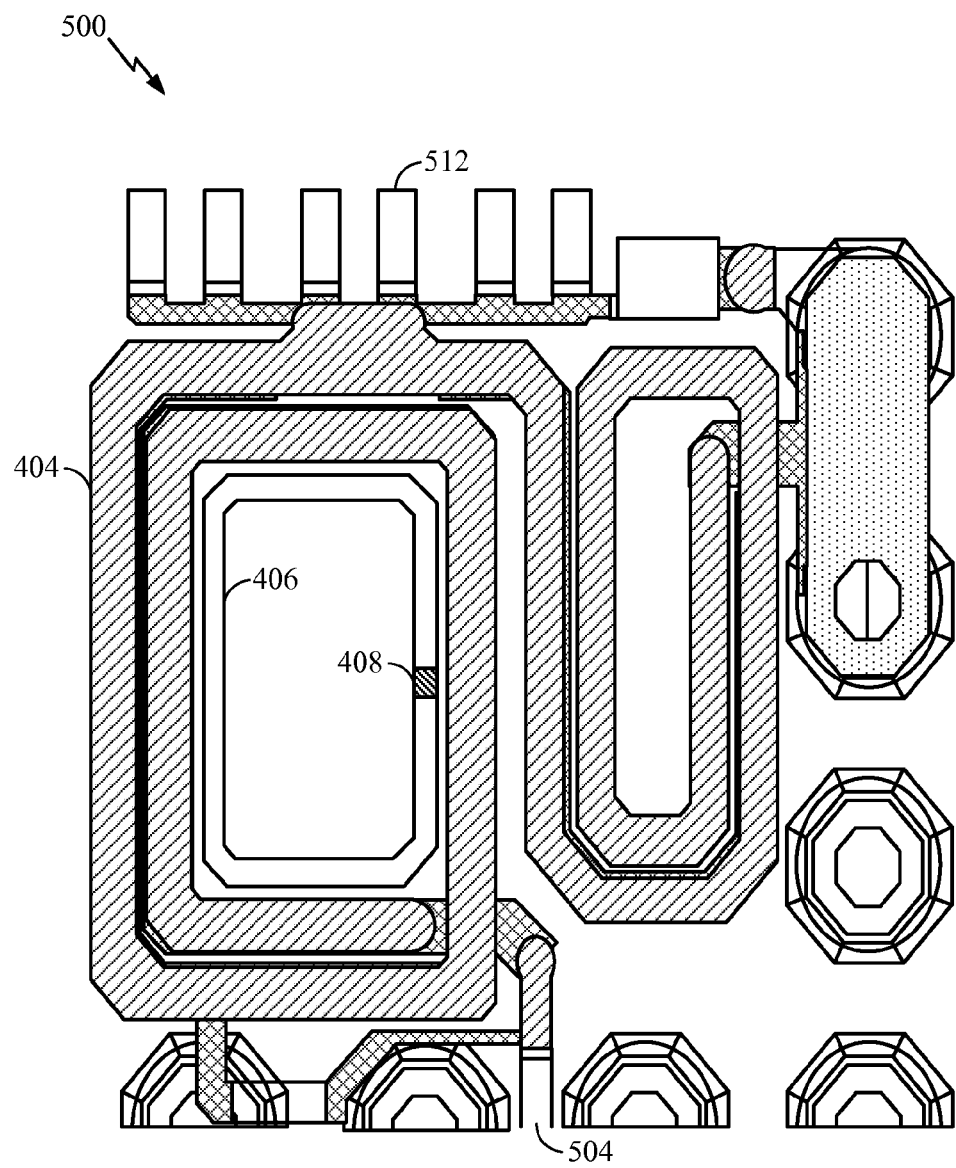
FIG. 5 is an example layout configuration of the impedance matching and resonant circuit of FIG. 4B, in accordance with certain aspects of the present disclosure.

FIG. 5 illustrates an example layout configuration 500 of the impedance matching and filtering circuit 412 of FIG. 4A. The layout 500 includes PA output transistors 512 and an output node 504, which may be coupled to the antenna 303. The layout 500 includes the inductor 404 coupled between the PA output transistors 512 and the output node 504. The inductor 404 may be formed using one or more rings of electrically conductive material, such as metal (e.g., copper, gold, or silver). The inductor 406 of the resonant circuit 414 may be disposed inside the inductor 404 of the impedance matching circuit. Accordingly, the inductor 406 may be located in close proximity with the inductor 404 in an effort to obtain better magnetic coupling. In addition, by placing the inductor 406 inside the inductor 404, the resonant circuit 414 does not occupy any additional area of an integrated circuit (i.e., area external to inductor 404). For other aspects, the inductor 406 of the resonant circuit 414 may be disposed outside, above, or below the inductor 404. To enhance magnetic coupling, a trace (e.g., the ring of conductive material) forming a loop of the inductor 404 may be located adjacent to a trace forming a loop of the inductor 406.

The ring of conductive material for the inductor 406 may have a gap such that ends of the ring surrounding the gap form the capacitor 408. To increase the capacitance, the gap may be filled with a dielectric material. The capacitor 408 may be an integrated circuit element, either of fixed value or variable value, connected to the ends of the inductor 406.

Figure 6:
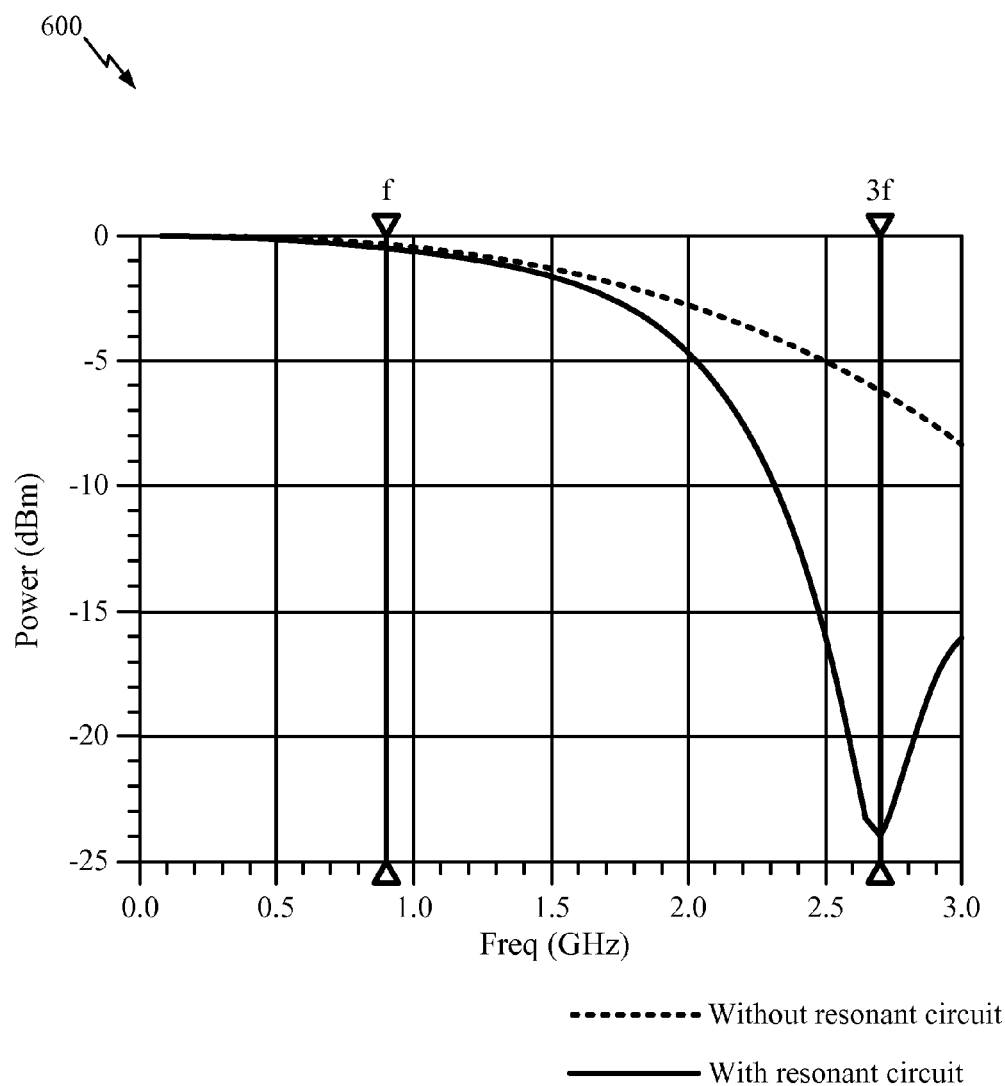
FIG. 6 is an example graph of logarithmic power versus frequency for the layout configuration of FIG. 5, in accordance with certain aspects of the present disclosure.

FIG. 6 is an example graph 600 of logarithmic power (in dBm) versus frequency (in GHz) for the circuit 412 according to the layout configuration 500 of FIG. 5 with and without the resonant circuit 414. The power at the output node 504 at a fundamental frequency of 900 MHz, with or without the resonant circuit 414, is approximately −0.67 dBm. However, at a third harmonic (2.7 GHz or three times the fundamental frequency), the power at the output node 504 with the resonant circuit 414 is approximately −24 dBm as compared to approximately −6.3 dBm without the resonant circuit 414. Accordingly, as illustrated by the graph 600, the resonant circuit 414 coupled with the inductor 404 creates a notch filter having a narrow stop-band at the resonant frequency of the resonant circuit. Moreover, the resonant circuit 414 has little effect on in-band performance of the PA output signal.

Figure 7:
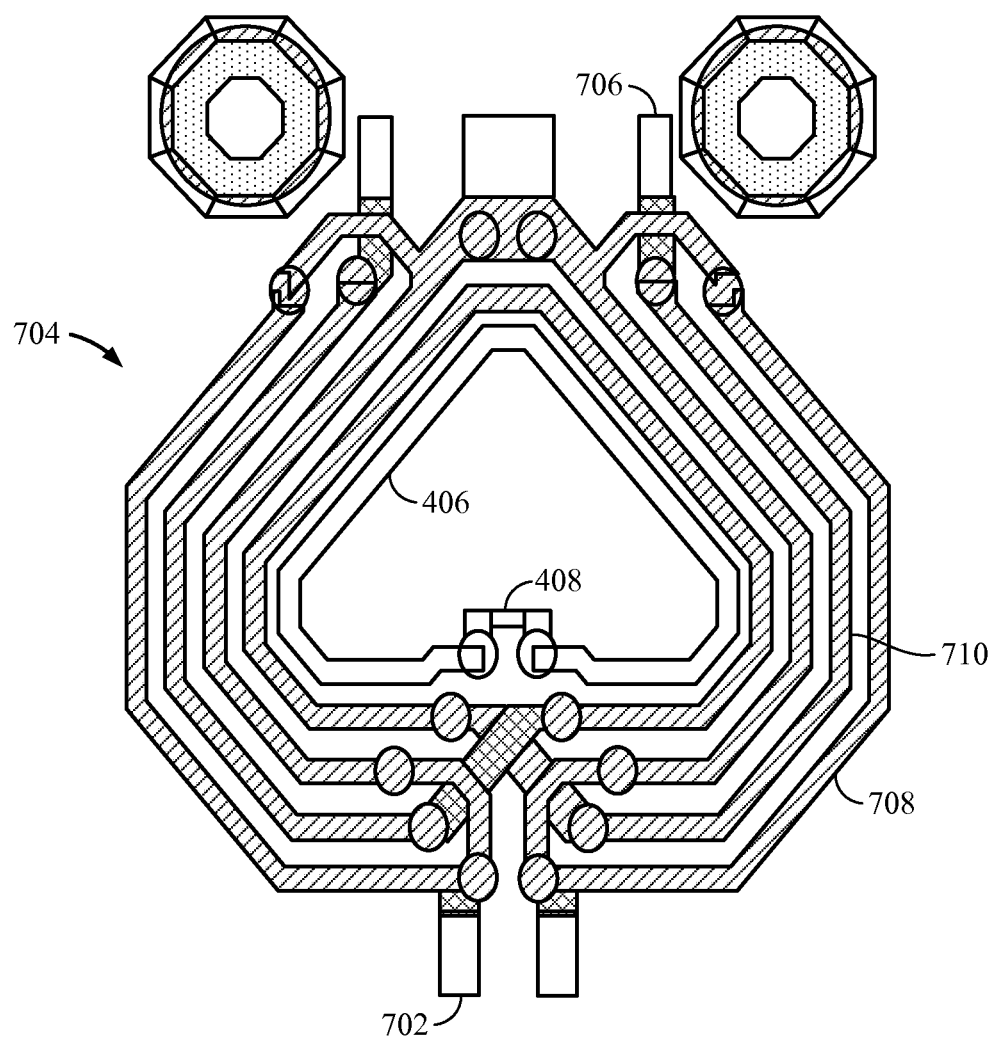
FIG. 7 is an example layout configuration of a resonant circuit coupled with a secondary winding of a transformer, in accordance with certain aspects of the present disclosure.

In certain aspects, the power amplifier 316 may be coupled with a primary winding of a transformer that may be magnetically coupled with a secondary winding of the transformer. Certain aspects of the present disclosure provide a similar resonant circuit 414 of FIG. 4B that is coupled with the primary or secondary winding of the transformer. FIG. 7 illustrates an example layout configuration of a transformer 704 having a primary winding 708 connected to PA output transistors 702 and a secondary winding 710 connected to an output node 706 of the impedance matching circuit. The secondary winding 710 may be magnetically coupled with the inductor 406 of the resonant circuit. The loop of conductive material forming the inductor 406 may comprise a gap filled with a dielectric to function as the capacitor 408, as described above, or the capacitor may be an integrated circuit element.

Figure 8:
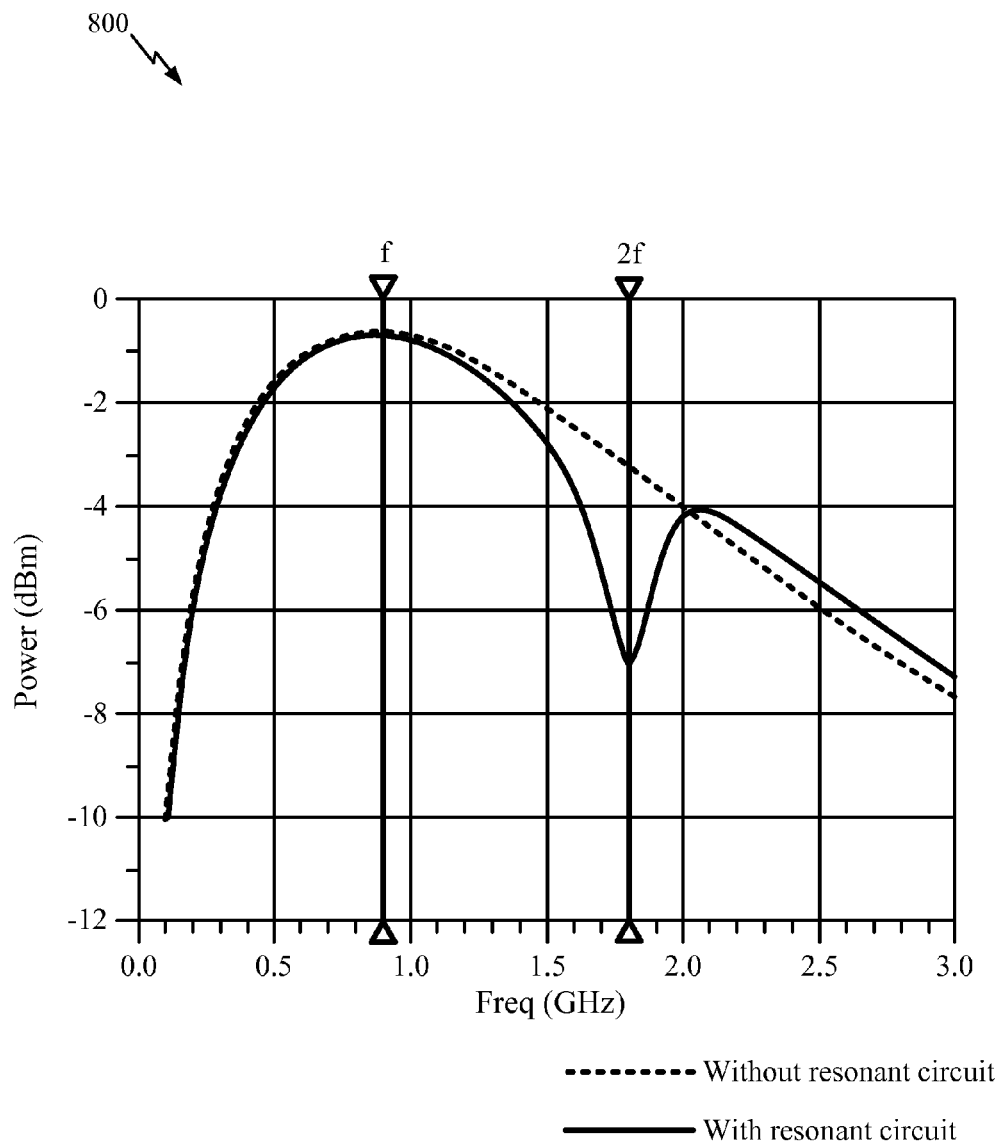
FIG. 8 is an example graph of logarithmic power versus frequency for the layout configuration shown in FIG. 7, in accordance with certain aspects of the present disclosure.

FIG. 8 is an example graph 800 of logarithmic power (in dBm) versus frequency (in GHz) according to the layout configuration of the transformer 704 in FIG. 7 with and without a resonant circuit 414. The power at the output node 706 at a fundamental frequency of 900 MHz, with or without the resonant circuit, is approximately −0.67 dBm. However, at a second harmonic (1.8 GHz or twice the fundamental frequency), the power at the output node 706 is approximately −7 dBm with the resonant circuit 414 as compared to approximately −3.2 dBm without the resonant circuit 414.

Figure 9:
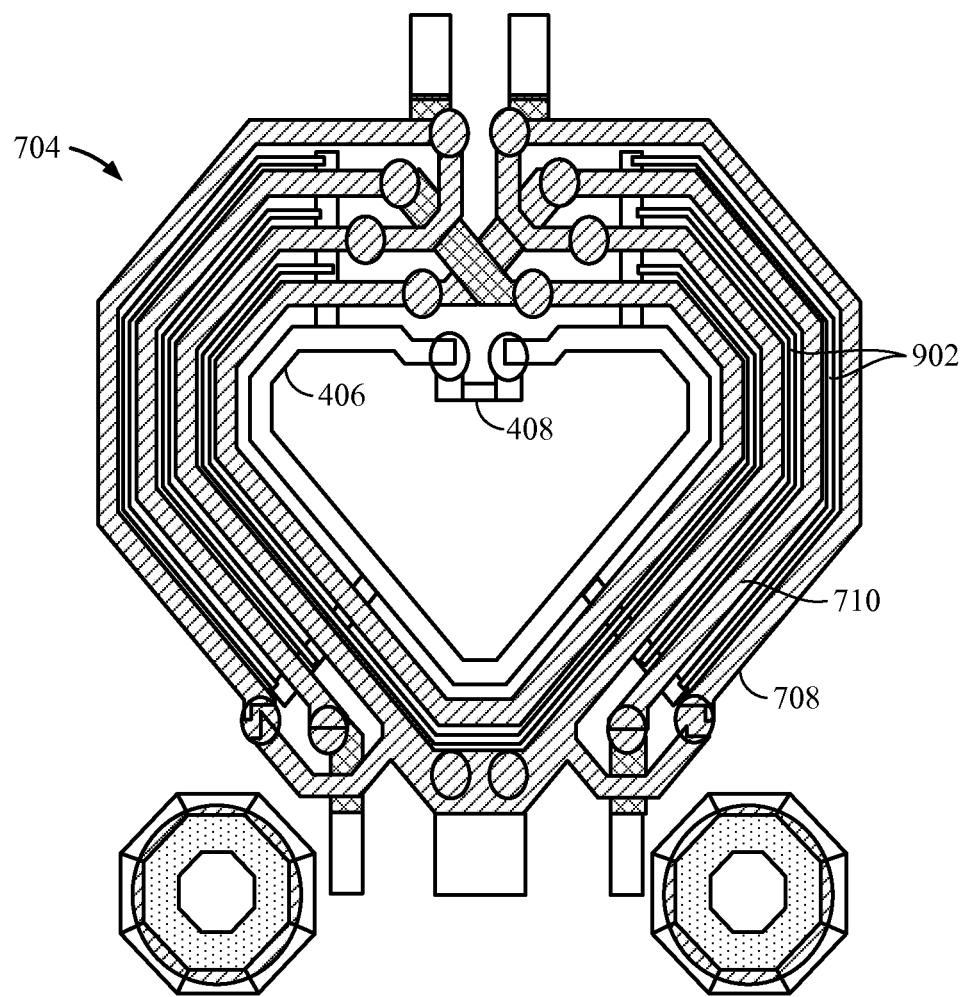
FIG. 9 is an example layout configuration of a resonant circuit having traces disposed between traces forming the primary and secondary windings of the transformer of FIG. 7, in accordance with certain aspects of the present disclosure.

In certain aspects as illustrated in FIG. 9, the inductor 406 may comprise a plurality of connected traces 902 that are disposed between the traces for the primary winding 708 and the secondary winding 710 of the transformer 704. By disposing the traces 902 between the winding traces of the transformer 704, stronger coupling may be obtained between the inductor 406 and the windings of the transformer 704. With stronger coupling, a greater amount of energy may be extracted from the transformer 704 at the resonant frequency of the resonant circuit 414.

Figure 10:
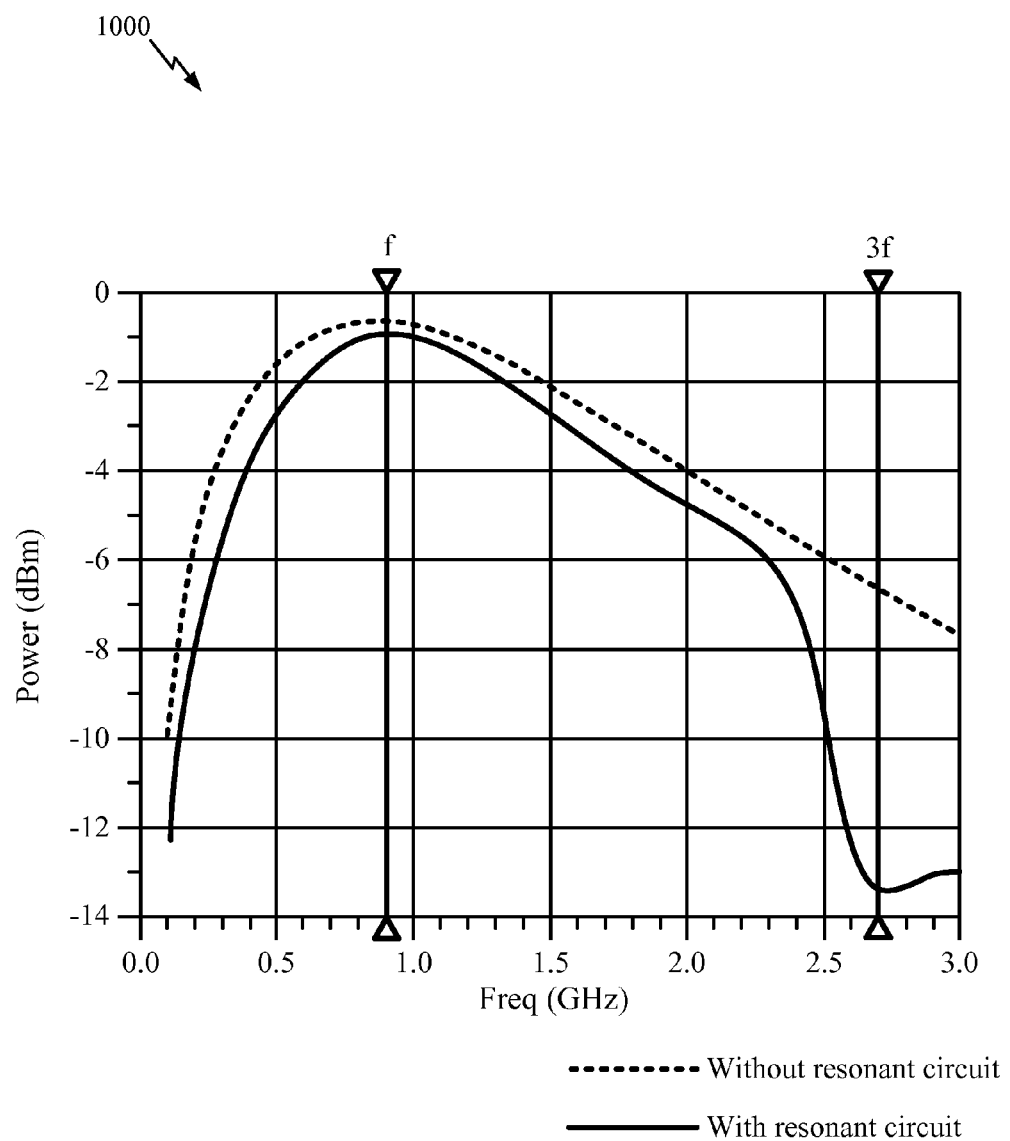
FIG. 10 is an example graph of logarithmic power versus frequency for the layout configuration presented in FIG. 9, in accordance with certain aspects of the present disclosure.

FIG. 10 is an example graph 1000 of logarithmic power (in dBm) versus frequency (in GHz) according to the layout configuration of the transformer 704 in FIG. 9 with and without the resonant circuit 414. The power measured at the output node 706 at a fundamental frequency of 900 MHz without the resonant circuit 414 is approximately −0.67 dBm compared to approximately −0.93 dBm with the resonant circuit 414. At a third harmonic (2.7 GHz or three times the fundamental frequency), the power at the output node 706 with the resonant circuit 414 is approximately −13.5 dBm as compared to approximately −6.6 dBm without the resonant circuit.

Figure 11:
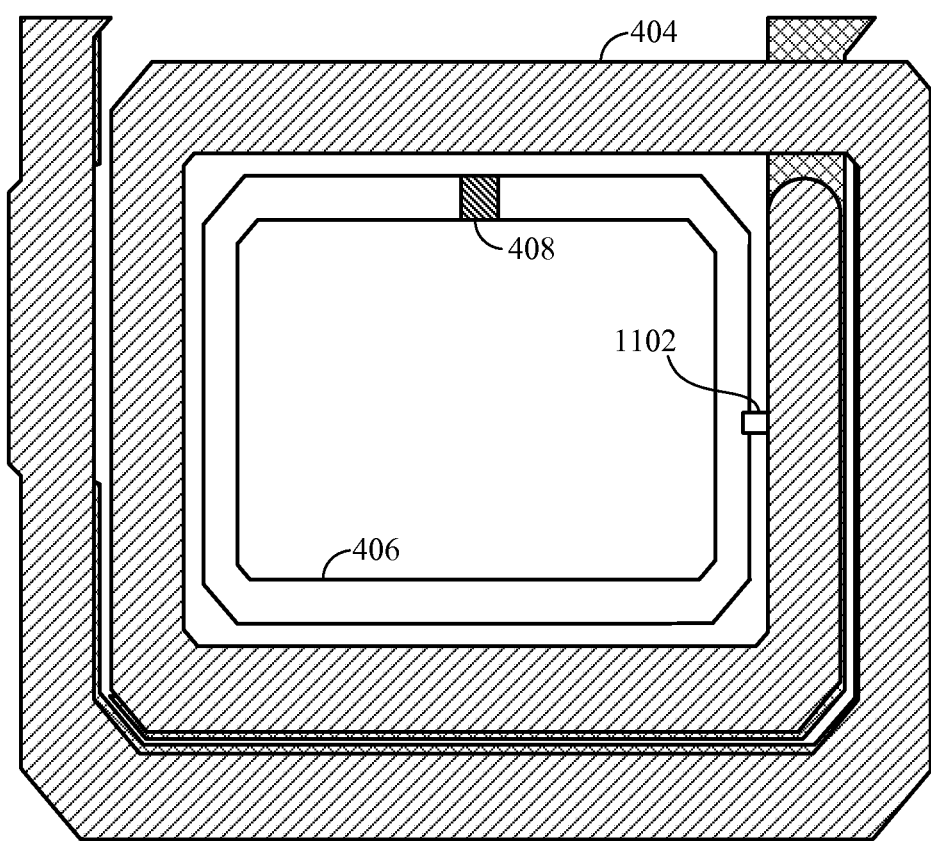
FIG. 11 is an example layout configuration of a resonant circuit having an inductor connected to an inductor of an impedance matching circuit, in accordance with certain aspects of the present disclosure.

In certain aspects as illustrated in FIG. 11, the inductor 406 of the resonant circuit 414 may be electrically shorted with an electrically conductive material 1102 (e.g., metal) to the inductor 404 of the impedance matching circuit 410. Connecting the inductor 406 to the inductor 404 has little electrical impact on the circuit operations, but avoids having unconnected metal in the layout.

Figure 12B:
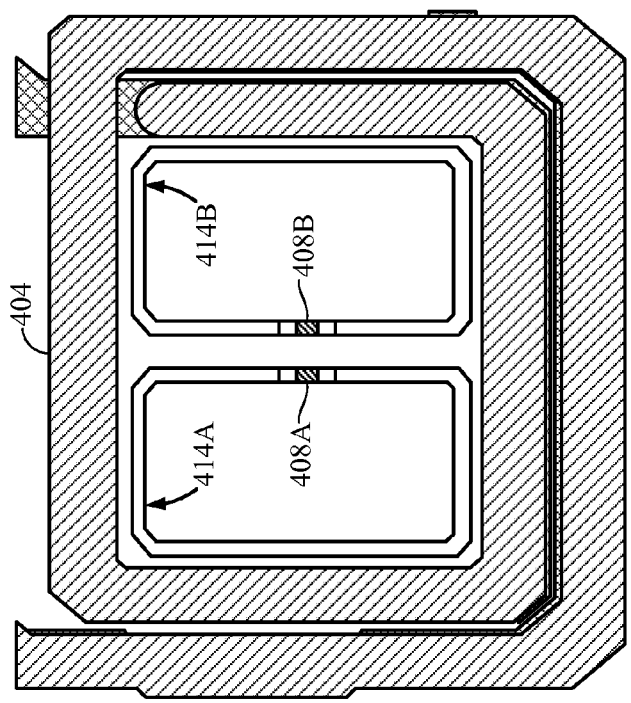
FIG. 12B is an example layout configuration of two resonant circuits disposed next to one another and inside traces that form an inductor of an impedance matching circuit, in accordance with certain aspects of the present disclosure.
Figure 12A:
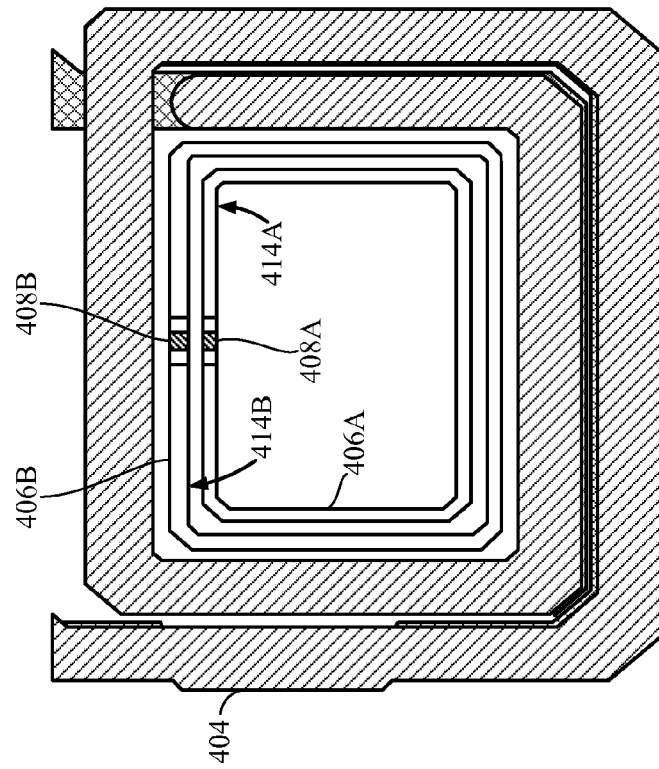
FIG. 12A is an example layout configuration of a first resonant circuit disposed inside traces that form a second resonant circuit, in accordance with certain aspects of the present disclosure.

In certain aspects of the present disclosure, a plurality of resonant circuits 414 may be coupled with the inductor 404 of the impedance matching circuit 410 or the windings of the transformer 704. Each of the plurality of resonant circuits 414 may be configured to operate at the same or at a different resonant frequency. For example, a first resonant circuit may be configured to have a resonant frequency at a second harmonic (e.g., twice the fundamental frequency), while another resonant circuit may be configured to have a resonant frequency at a third harmonic (e.g., three times the fundamental frequency). FIGS. 12A and 12B illustrate example layout configurations for coupling two resonant circuits with the inductor 404 of the impedance matching circuit 410. For example, a first resonant circuit 414A may be disposed inside a second resonant circuit 414B, as illustrated in FIG. 12A. The two resonant circuits 414A, 414B may be concentric for certain aspects. The dielectric material 408A in the first resonant circuit 414A may be the same or different from the dielectric material 408B in the second resonant circuit 414B. Furthermore, the dimensions of the gap in the inductor 406A of the first resonant circuit 414A may be the same or different from the dimensions of the gap in the inductor 406B in the second resonant circuit 414B. In certain aspects, a first resonant circuit 414A may be disposed adjacent to a second resonant circuit 414B, as illustrated in FIG. 12B. By arranging resonant circuits in this manner (i.e., in the open space inside the impedance matching circuit's inductor 404), one or more resonant circuits may be added without consuming any additional area on an integrated circuit (i.e., other than the space already occupied by the impedance matching circuit).

Figure 13:
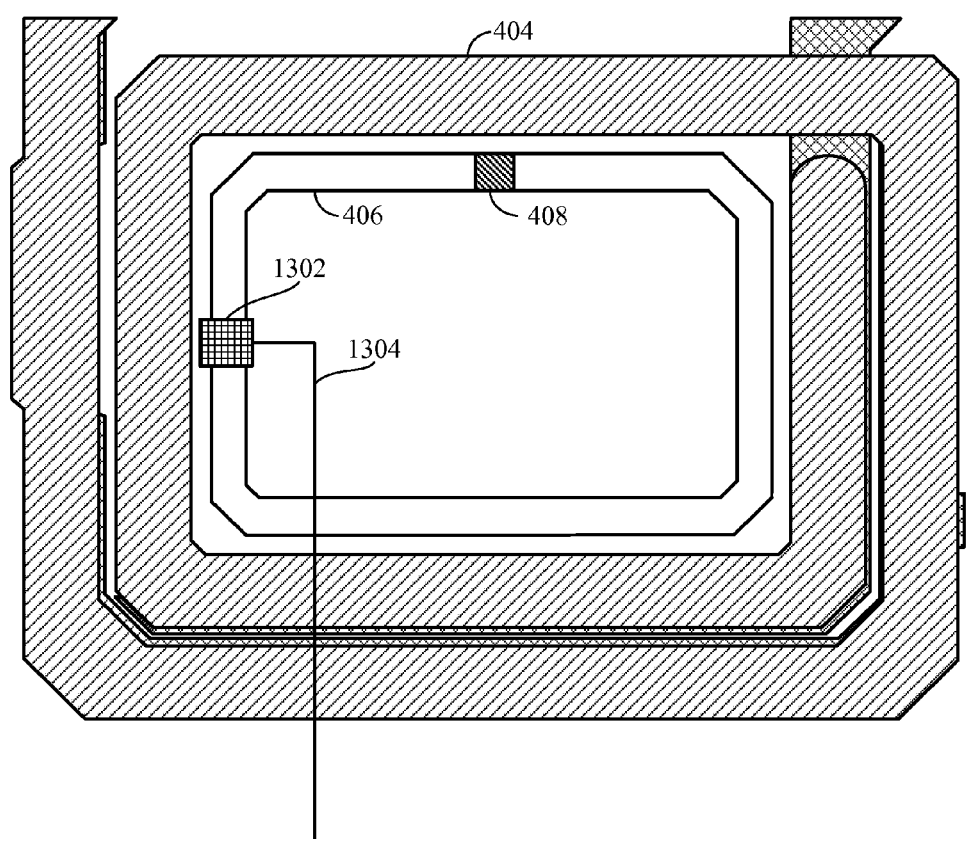
FIG. 13 is an example layout configuration of a trace forming an inductor of a resonant circuit having a switch controlled by a processor, in accordance with certain aspects of the present disclosure.

As illustrated in FIG. 13, a switch 1302 may be interposed in the conductive ring that forms the inductor 406. The switch 1302 may be opened or closed in response to a control signal on a control line 1304. In certain aspects, the control line 1304 may be connected with a controller, such as the controller 230 or 280 of FIG. 2. The switch 1302 may be opened such that no current can flow in the resonant circuit 414. Thus, the resonant circuit will be deactivated and may no longer impact the inductor 404 of the impedance matching circuit 410 or a winding of the transformer 704 of FIG. 7.

Figure 14:
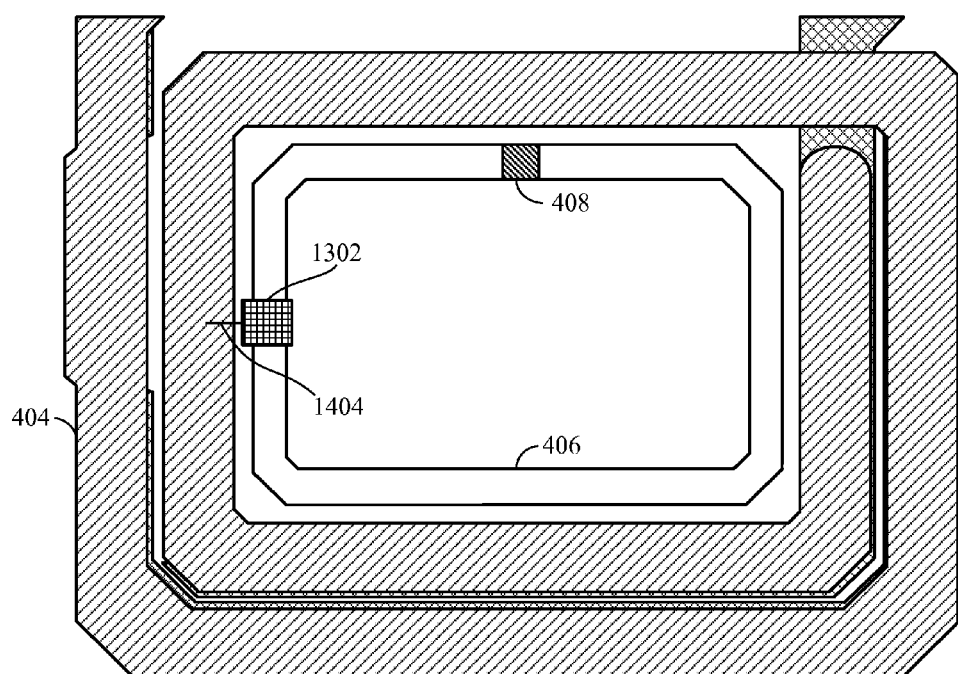
FIG. 14 is an example layout configuration of a trace forming an inductor of a resonant circuit having a switch connected to an inductor of an impedance matching circuit, in accordance with certain aspects of the present disclosure.

As illustrated in FIG. 14, a control line 1404 for the switch 1302 may be connected to the inductor 404 such that an amplitude of a signal in the inductor 404 controls an opening and closing of the switch 1302. In certain aspects, the control line may be connected to either a primary or secondary winding of a transformer, such as the transformer of FIG. 7.

Figure 15:
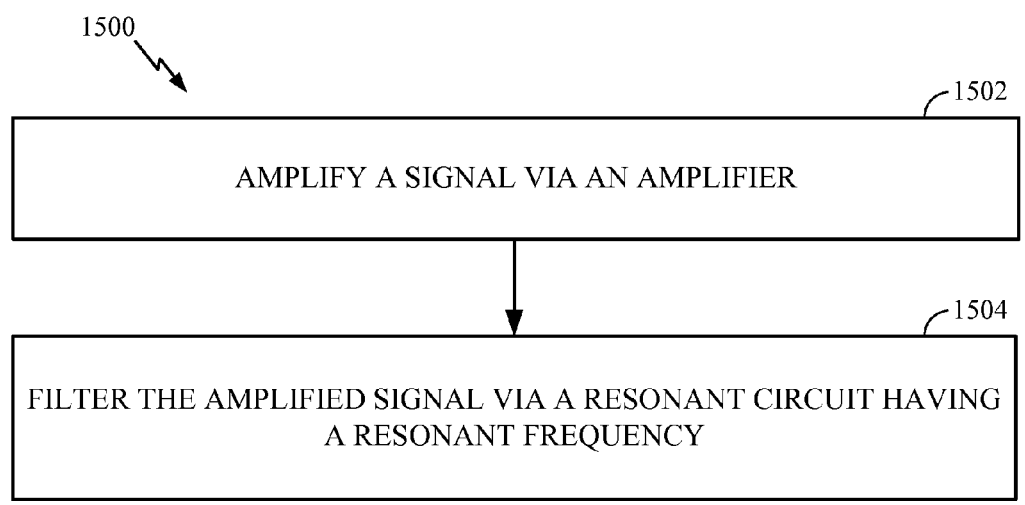
FIG. 15 is a flow diagram of example operations for filtering using an integrated impedance matching and filtering circuit, in accordance with certain aspects of the present disclosure.

FIG. 15 is a flow diagram of example operations 1500 for filtering using an integrated impedance matching and filtering circuit, in accordance with certain aspects of the present disclosure. The operations 1500 may begin, at 1502, with an amplifier (e.g., power amplifier 316) amplifying a signal. At 1504, a resonant circuit (e.g., resonant circuit 414) having a resonant frequency may filter the amplified signal. The resonant circuit is magnetically coupled to an impedance matching circuit (e.g., impedance matching circuit 410) for the amplifier. The resonant circuit is configured to filter the amplified signal by at least filtering out at least a portion of the resonant frequency from the impedance matching circuit. For example, the impedance matching circuit and the resonant circuit may be configured in any manner described above. According to certain aspects, filtering the amplified signal at 1504 entails extracting energy from the amplified signal at the resonant frequency via the resonant circuit.

According to certain aspects, the impedance matching circuit includes a first inductor (e.g., inductor 404). The resonant circuit may include a capacitor (e.g., capacitor 408) and a second inductor (e.g., inductor 406) magnetically coupled to the first inductor. For certain aspects, the second inductor may include an open ring of metal, and the capacitor may include a dielectric material disposed between ends of the open ring of metal.

According to certain aspects, the resonant frequency is a harmonic frequency of the amplified signal.

According to certain aspects, the operations 1500 further involve a switch (e.g., switch 1302) and/or a controller (e.g., controller 230 or 280) controlling deactivation (and activation) of the filtering of the amplified signal via the resonant circuit. For certain aspects, this deactivation (and activation) may be controlled based on an amplitude of a signal in the first inductor.

The various operations or methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, means for amplifying may include a power amplifier 316 as illustrated in FIGS. 3-4B. Means for impedance matching may include an impedance matching circuit 410 as depicted in FIG. 4. Means for filtering may include a resonant circuit 414 as shown in FIG. 4. Means for controlling deactivation (of the means for filtering) may include a switch 1302 as illustrated in FIG. 13 and/or a controller, such as the controller 230 or 280 of FIG. 2.

As used herein, a phrase referring to "at least one of" a list of items refers to any combination of those items, including single members. As an example, "at least one of: a, b, or c"

is intended to cover: a, b, c, a-b, a-c, b-c, a-b-c, and any combination thereof (e.g., a-b-b and a-a-b-c).

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC (Application Specific Integrated Circuit) with the processor, the bus interface, the user interface in the case of an access terminal), supporting circuitry, and at least a portion of the machine-readable media integrated into a single chip, or with one or more FPGAs (Field Programmable Gate Arrays), PLDs (Programmable Logic Devices), controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. An integrated impedance matching and filtering circuit comprising:
    an impedance matching circuit comprising a first inductor; and
    a first resonant circuit configured to filter out at least a portion of a first resonant frequency of the first resonant circuit from the impedance matching circuit, wherein:
        the first resonant circuit comprises a second inductor magnetically coupled to the first inductor; and
        the first resonant circuit is electrically floating and is lacking a connection to another circuit with an electrically conductive material.

2. The circuit of claim 1, wherein the first resonant circuit further comprises a capacitor and is a resonant inductor-capacitor (LC) tank circuit.

3. The circuit of claim 2, wherein the second inductor comprises an open ring of metal and wherein the capacitor comprises a dielectric material disposed between ends of the open ring of metal.

4. The circuit of claim 3, wherein the first inductor comprises one or more rings of metal that surround the open ring of metal of the second inductor.

5. The circuit of claim 3, wherein the first resonant circuit further comprises a switch interposed in the open ring of metal of the second inductor.

6. The circuit of claim 5, wherein a control line for the switch is connected to the first inductor such that an amplitude of a signal in the first inductor is configured to control opening and closing of the switch.

7. The circuit of claim 1, further comprising:
    a second resonant circuit configured to filter out at least a portion of a second resonant frequency of the second resonant circuit from the impedance matching circuit, wherein the second resonant circuit comprises a third inductor coupled to the first inductor.

8. The circuit of claim 7, wherein the first resonant frequency equals the second resonant frequency.

9. The circuit of claim 7, wherein the second resonant circuit further comprises a capacitor, wherein the third inductor comprises an open ring of metal, and wherein the capacitor comprises a dielectric material disposed between ends of the open ring of metal of the third inductor.

10. The circuit of claim 9, wherein the open ring of metal of the third inductor is disposed adjacent to an open ring of metal of the second inductor.

11. The circuit of claim 9, wherein the open ring of metal of the third inductor is disposed inside an open ring of metal of the second inductor.

12. The circuit of claim 9, wherein the first inductor comprises one or more rings of metal that surround at least one of an open ring of metal of the second inductor or the open ring of metal of the third inductor.

13. The circuit of claim 1, wherein a loop of the first inductor is substantially surrounded by or surrounds a loop of the second inductor and wherein a trace forming the loop of the first inductor is located adjacent to a trace forming the loop of the second inductor.

14. The circuit of claim 1, wherein the first resonant frequency comprises a harmonic frequency of an output signal from an amplifier coupled to the impedance matching circuit.

15. The circuit of claim 14, wherein the harmonic frequency comprises a second harmonic or a third harmonic of the output signal.

16. The circuit of claim 1, wherein the first resonant frequency comprises a global positioning system (GPS) frequency.

17. The circuit of claim 1, wherein the first resonant frequency is at or near a harmonic frequency of an output signal from an amplifier coupled to the impedance matching circuit and is configured to increase an efficiency of the amplifier.

18. The circuit of claim 1, wherein the impedance matching circuit comprises a transformer having a primary winding and a secondary winding magnetically coupled to the primary winding, wherein the first inductor is the primary winding or the secondary winding.

19. The circuit of claim 18, wherein the first resonant circuit further comprises a capacitor, wherein the second inductor comprises an open ring of metal, and wherein the capacitor comprises a dielectric material disposed between ends of the open ring of metal.

20. The circuit of claim 19, wherein one or more traces connected to the second inductor are disposed between traces forming the primary and secondary windings.

21. The circuit of claim 1, wherein the impedance matching circuit comprises a differential impedance matching circuit having the first inductor in a first branch of a differential signal pair and having a third inductor in a second branch of the differential signal pair.

22. The circuit of claim 21, further comprising:
a second resonant circuit having the first resonant frequency and comprising a fourth inductor coupled to the third inductor, wherein the second resonant circuit is configured to filter out at least a portion of the first resonant frequency from the second branch of the differential signal pair.

23. The circuit of claim 1, wherein the first resonant frequency is different from a frequency of a signal input to the impedance matching circuit.

24. A method of filtering, comprising:
amplifying a signal via an amplifier; and
filtering the amplified signal by at least filtering out at least a portion of a resonant frequency from an impedance matching circuit via a resonant circuit having the resonant frequency, wherein:
the resonant circuit is magnetically coupled to the impedance matching circuit for the amplifier; and
the resonant circuit is electrically floating and is lacking a connection to another circuit with an electrically conductive material.

25. The method of claim 24, wherein:
the impedance matching circuit comprises a first inductor;
the resonant circuit comprises a capacitor and a second inductor magnetically coupled to the first inductor;
the second inductor comprises an open ring of metal;
the capacitor comprises a dielectric material disposed between ends of the open ring of metal; and
the resonant frequency is a harmonic frequency of the amplified signal.

26. The method of claim 25, further comprising controlling deactivation of the filtering of the amplified signal via the resonant circuit based on an amplitude of a signal in the first inductor.

27. The method of claim 24, wherein filtering the amplified signal comprises extracting energy from the amplified signal at the resonant frequency via the resonant circuit.

28. An apparatus for wireless communications, comprising:
means for amplifying a signal;
means for impedance matching an output impedance of the means for amplifying; and
means for filtering out at least a portion of the amplified signal from the means for impedance matching at a resonant frequency, wherein the means for filtering:
is magnetically coupled to the means for impedance matching;
has the resonant frequency; and
is electrically floating and is lacking a connection to a circuit with an electrically conductive material.

29. The apparatus of claim 28, further comprising means for controlling deactivation of the means for filtering of the amplified signal based on a signal received at the means for controlling.

30. An integrated impedance matching and filtering circuit comprising:
an impedance matching circuit comprising a first inductor; and
a first resonant circuit configured to filter out at least a portion of a first resonant frequency of the first resonant circuit from the impedance matching circuit, the first resonant circuit comprising a second inductor magnetically coupled to the first inductor and a capacitor coupled to the second inductor, wherein:
the second inductor comprises an open ring of metal;
the capacitor comprises a dielectric material disposed between ends of the open ring of metal; and
the first resonant circuit further comprises a switch interposed in the open ring of metal of the second inductor.

31. The circuit of claim 30, wherein a control line for the switch is connected to the first inductor such that an amplitude of a signal in the first inductor is configured to control opening and closing of the switch.

32. The method of claim 24, wherein the resonant frequency of the resonant circuit is different from a frequency of the signal amplified by the amplifier.

* * * * *